United States Patent
Chiu et al.

(10) Patent No.: US 7,269,077 B2
(45) Date of Patent: Sep. 11, 2007

(54) MEMORY ARCHITECTURE OF DISPLAY DEVICE AND MEMORY WRITING METHOD FOR THE SAME

(75) Inventors: Ming Cheng Chiu, Hsinhua (TW); Tian Hau Chen, Hsinhua (TW); Chi Lun Hung, Hsinhua (TW)

(73) Assignee: Himax Technologies, Inc. (TW)

( * ) Notice: Subject to any disclaimer, the term of this patent is extended or adjusted under 35 U.S.C. 154(b) by 20 days.

(21) Appl. No.: 11/082,758

(22) Filed: Mar. 18, 2005

(65) Prior Publication Data

US 2006/0171191 A1    Aug. 3, 2006

(30) Foreign Application Priority Data

Jan. 20, 2005    (TW) .............................. 94101671 A

(51) Int. Cl.
*G11C 7/10*    (2006.01)
(52) U.S. Cl. ............................ 365/189.05; 365/230.05; 345/98
(58) Field of Classification Search ............ 365/189.05
See application file for complete search history.

(56) References Cited

U.S. PATENT DOCUMENTS

| | | | |
|---|---|---|---|
| 4,903,239 A * | 2/1990 | Akashi ................... 365/189.01 |
| 5,504,709 A * | 4/1996 | Yabe et al. ............. 365/189.05 |
| 5,561,633 A * | 10/1996 | Yamano ................. 365/189.01 |
| 5,724,061 A * | 3/1998 | Kanbara ..................... 345/100 |
| 6,157,578 A | 12/2000 | Brady |
| 6,456,526 B2 | 9/2002 | Tsujikawa et al. |
| 6,487,127 B2 * | 11/2002 | Johnson et al. ......... 365/189.05 |
| 6,728,161 B1 | 4/2004 | Roohparvar |
| 6,756,959 B2 * | 6/2004 | Fujino .......................... 345/95 |
| 6,756,987 B2 | 6/2004 | Goyins et al. |
| 6,791,539 B2 * | 9/2004 | Nakajima et al. ........... 345/204 |
| 6,822,911 B2 * | 11/2004 | Cernea .................. 365/189.05 |
| 6,958,507 B2 * | 10/2005 | Atwood et al. ............. 257/296 |
| 7,200,030 B2 * | 4/2007 | Yamaoka et al. ........... 365/154 |
| 2002/0075272 A1 * | 6/2002 | Tani et al. ................... 345/531 |
| 2004/0264259 A1 * | 12/2004 | Hayashi et al. ......... 365/189.05 |
| 2005/0001846 A1 * | 1/2005 | Shiono ....................... 345/531 |
| 2005/0099375 A1 * | 5/2005 | Moriyama et al. ............ 345/98 |

* cited by examiner

*Primary Examiner*—Son L. Mai
(74) *Attorney, Agent, or Firm*—Smith, Gambrell & Russell, LLP

(57) ABSTRACT

A memory architecture of display device comprises a memory cell array having a plurality of memory cells arranged as a plurality of cell rows and a plurality of cell columns, and a data latch circuit having a plurality of latch units for storing a plurality of bits; wherein the number of the latch units is equal to that of the memory cells in each cell row, such that each bit stored in the data latch circuit can be written to each memory cell of one cell row at one time. The present invention also provides a memory writing method.

27 Claims, 4 Drawing Sheets

MEMORY ARCHITECTURE OF DISPLAY DEVICE AND MEMORY WRITING METHOD FOR THE SAME

CROSS REFERENCE TO RELATED APPLICATION

This application claims the priority benefit of Taiwan Patent Application Serial Number 094101671, filed on Jan. 20, 2005, the full disclosure of which is incorporated herein by reference.

BACKGROUND OF THE INVENTION

1. Field of the Invention

This invention generally relates to a memory architecture and a memory writing method for the same, and more particularly to a memory architecture of display device and a memory writing method for the same.

2. Description of the Related Art

FIG. 1 is a schematic circuit of a conventional memory module 100 for portable display devices such as mobile phones or personal digital assistants (PDA). The memory module 100 comprises a memory cell array 102 having a plurality of memory cells 102a arranged as n cell rows and m cell columns, and a pre-charge circuit 104 consisting of several transistors 106. Each memory cell 102a is used for storing one bit, e.g. a low logic level "0" or a high logic level "1", and generally accomplished by 4T (four MOS transistors) or 6T (six MOS transistors) structure of SRAM cell. A plurality of wordlines WL0, WL1, WL2 and WLn are respectively connected to each cell row in the memory cell array 102. A plurality of pairs of complementary bitlines B0, BB0 and Bm, BBm are respectively connected to each cell column in the memory cell array 102, wherein each bitline B0, BB0, Bm, BBm respectively has a parasitic capacitor CB0, CBB0, CBm, CBBm connected to a common voltage VCOM. The pre-charge circuit 104 has a plurality of outputs 104a respectively connected to each bitline B0, BB0, Bm, BBm.

Before the memory cell array 102 is activated to perform a data writing operation, the input voltage level PRECH of the pre-charge circuit 104 is presented as low logic level such that each transistor 106 is turned on; meanwhile, each parasitic capacitor CB0, CBB0, CBm, CBBm at the bitlines B0, BB0, Bm, BBm is precharged to a voltage level VDD through each output 104a of the pre-charge circuit 104. Then, the input voltage level PRECH is presented as high logic level so as to turn off the pre-charge circuit 104; meanwhile, one of the wordlines WL0, WL1, WL2 and WLn (e.g. wordline WL0) turns on one cell row such that one memory cell 102a (e.g. the leftmost cell memory 102a) in the turned-on cell row can be written by data (logic level "0" or "1") through the pair of complementary bitlines (e.g. the complementary bitlines B0, BB0) connected thereof.

During the data writing operation, although only one memory cell 102a (e.g. the leftmost cell memory 102a) in the turned-on cell row can be written by data (logic level "0" or "1"), the other memory cells 102a in the same cell row will have their data and complementary data stored thereof applied to their corresponding pairs of complementary bitlines, such that one bitline of each corresponding pair has its parasitic capacitor discharged to a low voltage level (e.g. ground level) from the voltage level VDD. Therefore, before the next data writing operation, the pre-charge circuit 104 charges again each parasitic capacitor CB0, CBB0, CBm, CBBm at the bitlines B0, BB0, Bm, BBm, that is, charges the parasitic capacitors having the low voltage level (e.g. ground level) to the voltage level VDD so as to begin the next data writing operation.

However, in the memory module 100, only one memory cell 102a is written by data during each data writing operation. Further, before each memory cell 102a is to be written by data, the parasitic capacitors having the low voltage level (e.g. ground level) are required to be precharged to the voltage level VDD. Therefore, when the number of memory cells 102a to be written by data increases, the number of times for charging and discharging the parasitic capacitors will relatively increase, which may cause additional power consumption.

Accordingly, the present invention provides a memory architecture of display device and a memory writing method for the same so as to solve the above-mentioned problem existing in the art.

SUMMARY OF THE INVENTION

It is an object of the present invention to provide a memory architecture of display device and a memory writing method for the same, which can efficiently decrease the power consumption caused by writing data to memory cells.

In order to achieve the above object, the memory architecture of display device comprises a memory cell array having a plurality of memory cells arranged as a plurality of cell rows and a plurality of cell columns, and a data latch circuit having a plurality of latch units for storing a plurality of bits; wherein the number of the latch units is equal to that of the memory cells in each cell row, such that each bit stored in the data latch circuit can be written to each memory cell of one cell row at one time.

The present invention also provides a memory writing method for a memory architecture of display device, which comprises a data latch circuit and a memory cell array having a plurality of memory cells arranged as a plurality of cell rows and a plurality of cell columns, wherein the memory writing method comprises following steps: reading a plurality of data out from the memory cell array and writing the plurality of data into the data latch circuit; updating the data written to the data latch circuit; and reading the updated data out from the data latch circuit and writing the updated data back to the memory cell array.

According to the memory architecture of display device and the memory writing method, a plurality of data to be written to one cell row can be stored in the data latch circuit in advance such that all the data stored in the data latch circuit can be simultaneously written to the memory cells of the cell row at one time while a wordline connected to the cell row is selected. As compared with the conventional method in which only one memory cell is to be written during one data writing operation, the memory architecture and the memory writing method of the present invention can write a plurality of bits into the memory cells of one cell row at one time while a corresponding wordline is selected; therefore, the memory architecture and the memory writing method according to the present invention can decrease the number of times for writing data to the memory cell array and thus decrease the number of times for charging and discharging the parasitic capacitors at the bitlines such that the power consumption caused by writing data to the memory cells can be efficiently decreased.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
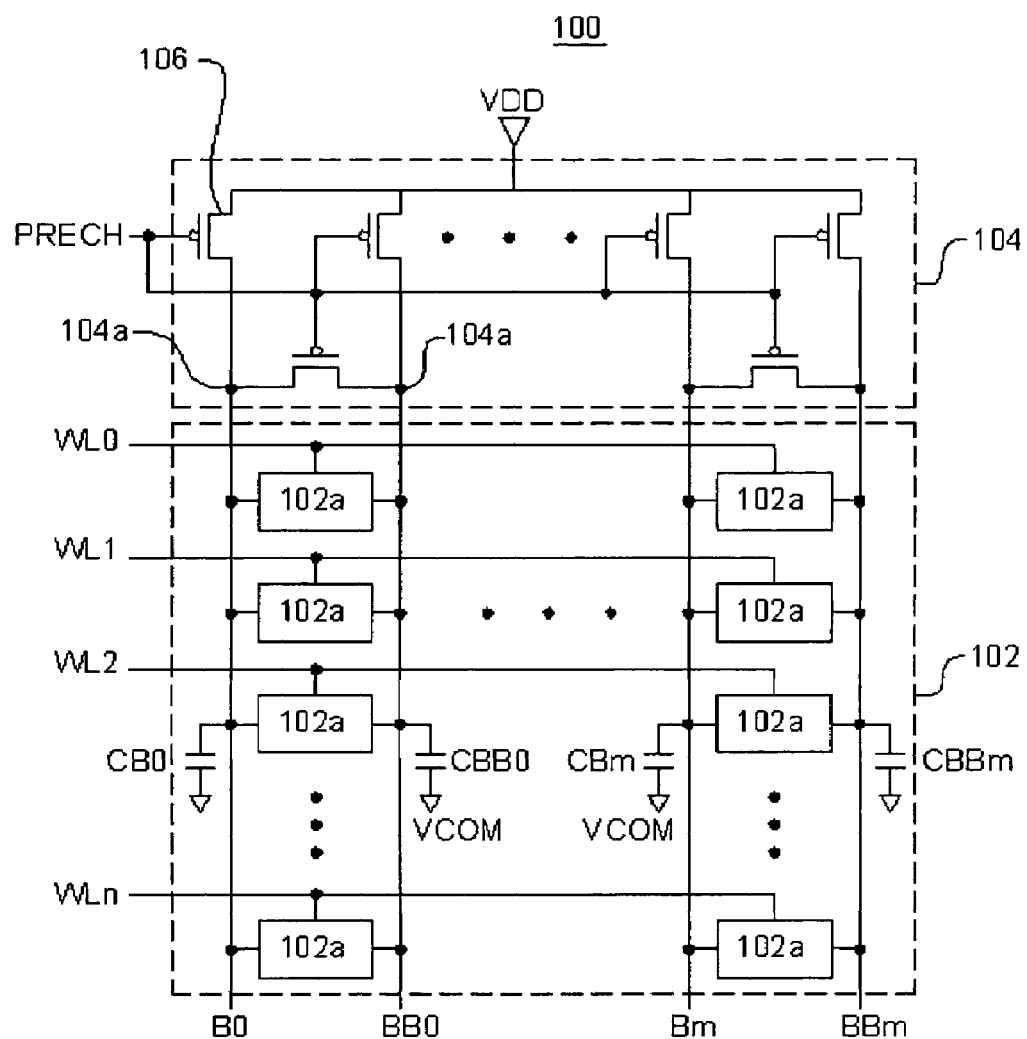
FIG. 1 is a schematic circuit of a conventional memory module of display device.
Figure 2:
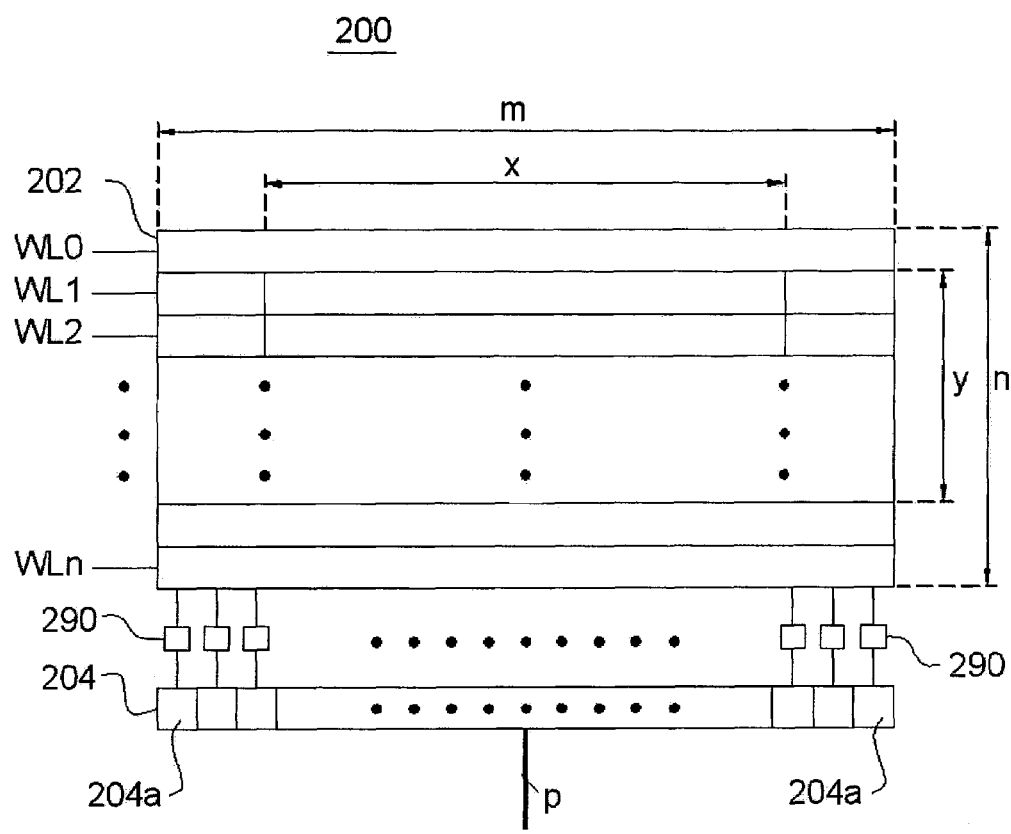
FIG. 2 is a schematic circuit of a memory module of display device according to one embodiment of the present invention.

FIG. 2 is a schematic view of a memory architecture 200 according to one embodiment of the present invention. The memory architecture 200 is used for storing image data and then displaying the image data through a display panel, and applied to a portable display device, having a small display panel or a lower display response time, such as mobile phones or personal digital assistants (PDA).

The memory architecture 200 comprises a memory cell array 202 and a data latch circuit 204. The structure of the memory cell array 202 is shown as FIG. 3. The memory cell array 202 comprises a plurality of memory cells 202a arranged as n cell rows and m cell columns. Each memory cell 202a is used for storing one bit (e.g. a low logic level "0" or a high logic level "1") and one complementary bit, and generally accomplished by SRAM cell. A plurality of wordlines (n wordlines) WL0, WL1, WL2 and WLn are respectively connected to each cell row for selectively turning on each memory cell 202a in each cell row. A plurality of pairs (m pairs) of complementary bitlines B0, BB0 and Bm, BBm are respectively connected to each cell column in the memory cell array 202, wherein each pair of complementary bitlines B0, BB0 and Bm, BBm are used for transmitting two complementary bits. Each bitline B0, BB0, Bm, BBm respectively has a parasitic capacitor CB0, CBB0, CBm, CBBm connected to a common voltage VCOM. In addition, each bitline B0, BB0, Bm, BBm has one terminal 203 connected to a pre-charge circuit (not shown).

Before the memory cell array 202 is activated to perform a data writing operation, the pre-charge circuit (not shown) will charge each parasitic capacitor CB0, CBB0, CBm, CBBm at the bitlines B0, BB0, Bm, BBm; then, one of the wordlines WL0, WL1, WL2 and WLn (e.g. wordline WL0) turns on each memory cell 202a in one cell row (e.g. topmost cell row) such that the data at the bitlines B0, BB0 and Bm, BBm can be written to each memory cell 202a in the cell row (e.g. topmost cell row).

Data latch circuit 204 consists of a plurality of latch units (m latch units) 204a, and each latch unit 204a is used for storing (i.e. latching) one bit (e.g. a low logic level "0" or a high logic level "1") and one complementary bit. The number (i.e. m) of the latch units 204a is equal to the number (i.e. m) of the memory cells 202a in each cell row. More specifically, the data storing capacity of the data latch circuit 204 is equal to that of each cell row. The data latch circuit 204 is electrically connected to the memory cell array 202 through the plurality of pairs (m pairs) of complementary bitlines B0, BB0 and Bm, BBm, wherein each latch unit 204a is respectively connected to each memory cell 202a in each cell row through each pair of complementary bitlines. For example, the leftmost latch unit 204a of the data latch circuit 204 is connected to each memory cell 202a in the leftmost cell column through the pair of complementary bitlines B0, BB0.

The following paragraph will provide two embodiments for illustrating two memory writing methods according to the memory architecture 200 of the present invention. In the two memory writing methods, it is assumed that the memory cell array 202 will have x*y memory cells 202a to be written by data wherein the mark "*" herein is referred to multiplication. That is, each of y cell rows has x memory cells 202a to be written by data as shown in FIG. 2, wherein the wordline WL1 is connected to the topmost cell row of the y cell rows.

According to the memory writing method of the first embodiment, firstly, x bits to be written to the topmost cell row (i.e. the row connected to the wordline WL1) of the y cell rows are written, through a plurality of pairs (p pairs) of complementary data lines, to the latch units 204a connected to the x memory cells 202a of the topmost cell row. Then, the wordline WL1 turns on each memory cells 202a of the topmost cell row such that the x bits written to (or stored/latched in) the latch units 204a of the data latch circuit 204 can be read out and then written, through the complementary bitlines, to the x memory cells 202a of the topmost cell row.

After finishing the data writing operation for the x memory cells 202a of the topmost cell row, other x bits to be written to the second cell row (i.e. the row connected to the wordline WL2) of the y cell rows are written to the latch units 204a connected to the x memory cells 202a of the second cell row. Then, the wordline WL2 turns on each memory cells 202a of the second cell row such that the x bits written to (or stored/latched in) the latch units 204a of the data latch circuit 204 can be read out and then written, through the complementary bitlines, to the x memory cells 202a of the second cell row.

Thereafter, the x memory cells 202a of other cell rows in the y cell rows will be written by data sequentially according to the above-mentioned steps, so as to achieve the data writing operations for the x*y memory cells 202a.

In this embodiment, when the x bits stored in the data latch circuit 204 are read out and written to the x memory cells 202a of one activated cell row, the invalid bits (i.e. the bits other than the x bits) stored in the data latch circuit 204 are required to avoid being written to the activated cell row so as to prevent the invalid bits from covering or damaging the data stored in other memory cells (i.e. the memory cells other than the x memory cells 202a) of the activated cell row. Therefore, in the memory writing method according to the first embodiment of the present invention, the memory architecture 200 further comprises m controlling switches 290 for controlling whether the bit stored in each latch unit 204a of the data latch circuit 204 should be read out and written to the memory cells 202a of the activated cell row. For example, each controlling switch 290 can be disposed between each latch unit 204a and each pair of complementary bitlines such that the bit stored in each latch unit 204a can be selectively written to the activated cell row by controlling the "ON" state or "OFF" state of each controlling switch 290, whereby preventing the invalid bits from being written to the activated cell row.

According to the memory writing method of the second embodiment, firstly, the wordline WL1 turns on each memory cell in the topmost cell row (i.e. the row connected to the wordline WL1) of the y cell rows such that the bits stored in all the memory cells of the topmost cell row are read out and respectively written to each latch unit 204a of the data latch circuit 204 through each pair of complementary bitlines B0, BB0 and Bm, BBm. Then, the wordline WL1 is turned off, and x bits to be written to the topmost cell row (i.e. the row connected to the wordline WL1) of the y cell rows are written, through a plurality of pairs (p pairs) of complementary data lines, to the latch units 204a connected to the x memory cells 202a of the topmost cell row; whereby updating the bits written to (or stored/latched in) the data latch circuit 204. Then again, the wordline WL1 turns on each memory cell in the topmost cell row of the y cell rows such that the bits stored in all the latch units 204a of the data latch circuit 204 are read out and respectively written back to each memory cell of the topmost cell row through each pair of complementary bitlines B0, BB0 and Bm, BBm.

After finishing the data writing operation for the x memory cells 202a of the topmost cell row, the wordline WL2 turns on each memory cell in the second cell row (i.e. the row connected to the wordline WL2) of the y cell rows such that the bits stored in all the memory cells of the second cell row are read out and respectively written to each latch unit 204a of the data latch circuit 204 through each pair of complementary bitlines B0, BB0 and Bm, BBm. Then, the wordline WL2 is turned off, and x bits to be written to the second cell row (i.e. the row connected to the wordline WL2) of the y cell rows are written, through a plurality of inputs (p inputs) of the data latch circuit 204, to the latch units 204a connected to the x memory cells 202a of the second cell row; whereby updating the bits written to (or stored/latched in) the data latch circuit 204. Then again, the wordline WL2 turns on each memory cell in the second cell row of the y cell rows such that the bits stored in all the latch units 204a of the data latch circuit 204 are read out and respectively written back to each memory cell of the second cell row through each pair of complementary bitlines B0, BB0 and Bm, BBm.

Thereafter, the x memory cells 202a of other cell rows in the y cell rows will be written by data sequentially according to the above-mentioned steps, so as to achieve the data writing operations for the x*y memory cells 202a.

In this embodiment, the bits stored in other memory cells 202a, other than the x memory cells, in the activated (turned-on) cell row are firstly read out and written to the data latch circuit 204, and then read out again from the data latch circuit 204 and written back to the original memory cells 202a. In this manner, the memory writing method according to the second embodiment of the present invention can solve the problem caused while the invalid bits are written to the activated cell row. Therefore, the memory architecture 200 is not required to have m controlling switches for preventing the invalid bits from being written to the activated cell row.

Figure 4:
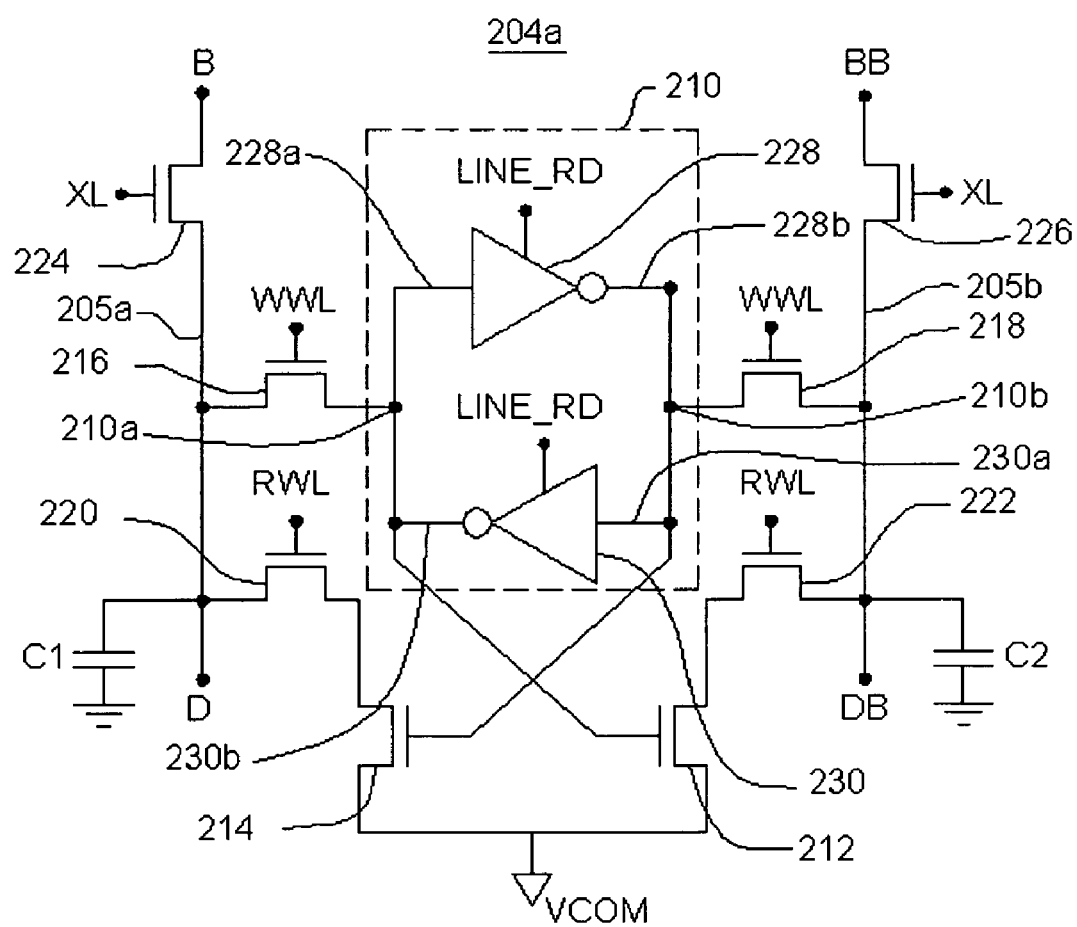
FIG. 4 is a schematic circuit of a latch unit according to one embodiment of the present invention.

According to the memory writing method of the second embodiment, the circuit architecture of the latch unit 204a is shown in FIG. 4. In FIG. 4, the latch unit 204a comprises a latch 210 and a plurality of NMOS (N-type metal oxide semiconductor) transistors 212, 214, 216, 218, 220, 222, 224, 226. A conductive line 205a connected to the transistors 216, 220, 224 has a parasitic capacitor C1, and a conductive line 205b connected to the transistors 218, 222, 226 has a parasitic capacitor C2.

The latch 210 consists of two inverters 228, 230 and has two latching terminals 210a, 210b for latching two complementary bits. The input 228a of the inverter 228 is electrically connected to the output 230b of the inverter 230 so as to form the latching terminal 210a; the output 228b of the inverter 228 is electrically connected to the input 230a of the inverter 230 so as to form the latching terminal 210b. In addition, the inverters 228, 230 can be turned on by a controlling signal LINE_RD.

The transistor 212 has its gate electrically connected to the latching terminal 210a, its source electrically connected to a common voltage (e.g. ground) VCOM, and its drain electrically connected to the source of the transistor 222. The transistor 214 has its gate electrically connected to the latching terminal 210b, its source electrically connected to a common voltage (e.g. ground) VCOM, and its drain electrically connected to the source of the transistor 220.

Transistor 216 functions as a switch and has its gate receive a controlling signal WWL, its source electrically connected to the latching terminal 210a, and its drain electrically connected to the drain of the transistor 220 and the source of the transistor 224 through the conductive line 205a. When the transistor 216 is turned on, its drain can receive a first bit from one data line D of an external circuit (not shown) or from one bitline B of the memory cell array 202 such that the received first bit can be latched at the latching terminal 210a. Transistor 218 functions as a switch and has its gate receive the controlling signal WWL, its source electrically connected to the latching terminal 210b, and its drain electrically connected to the drain of the transistor 222 and the source of the transistor 226 through the conductive line 205b. When the transistor 218 is turned on, its drain can receive a second bit from one data line DB of the external circuit (not shown) or from one bitline BB of the memory cell array 202 such that the received second bit can be latched at the latching terminal 210b; wherein the bitlines B and BB are a pair of complementary bitlines, and the second bit is complementary to the first bit received by the drain of the transistor 216.

Transistor 220 functions as a switch and has its gate receive a controlling signal RWL, its source electrically connected to the drain of the transistor 214, and its drain electrically connected to the drain of the transistor 216 and the source of the transistor 224. When the transistor 220 is turned on, its drain can output the first bit latched at the latching terminal 210a through the inverter 228 and the transistor 214 to the bitline B. Transistor 222 functions as a switch and has its gate receive the controlling signal RWL, its source electrically connected to the drain of the transistor 212, and its drain electrically connected to the drain of the transistor 218 and the source of the transistor 226. When the transistor 222 is turned on, its drain can output the second bit latched at the latching terminal 210b through the inverter 230 and the transistor 212 to the bitline BB.

Transistor 224 functions as a switch and has its gate receive a controlling signal XL, its source electrically connected to the drains of the transistor 216 and 220, and its drain electrically connected to the bitline B. When the transistor 224 is turned on, the latch unit 204a can read the first bit from one activated memory cell through the bitline B, or transmit the first bit latched at the latching terminal 210a to the activated memory cell. Transistor 226 functions as a switch and has its gate receive the controlling signal XL, its source electrically connected to the drains of the transistor 218 and 222, and its drain electrically connected to the bitline BB. When the transistor 226 is turned on, the latch unit 204a can read the second bit from the activated memory cell through the bitline BB, or transmit the second bit latched at the latching terminal 210b to the activated memory cell.

The following paragraph will illustrate the operation of the latch unit 204a of FIG. 4 for accomplishing the memory writing method according to the second embodiment of the present invention, and it is assumed that one bit and one complementary bit are to be written to one memory cell of the memory cell array 202.

Firstly, the controlling signals LINE_RD, RWL are presented as low voltage level and the controlling signals XL, WWL are presented as high voltage level, such that the latch 210 and the transistors 220, 222 are turned off and the transistors 216, 218, 224, 226 are turned on; meanwhile, two complementary bits are read out from one activated memory cell 202a and respectively transmitted and latched (i.e. written) to the latching terminals 210a, 210b through the bitlines B, BB.

Then, the controlling signals RWL, XL are presented as low voltage level and the controlling signals LINE_RD, WWL are presented as high voltage level, such that the transistors 220, 222, 224, 226 are turned off and the latch 210 and the transistors 216, 218 are turned on. Meanwhile, if the two complementary bits of the activated memory cell 202a are to be updated, two new complementary bits will read out from an external circuit (not shown) and respectively transmitted and latched (i.e. written) to the latching terminals 210a, 210b so as to update the two complementary bits at the latching terminals 210a, 210b. In addition, if the two complementary bits of the activated memory cell 202a are not to be updated, the bits at the latching terminals 210a, 210b will be maintained.

Finally, the controlling signal WWL is presented as low voltage level and the controlling signals LINE_RD, RWL, XL are presented as high voltage level, such that the transistors 220, 222, 224, 226 are turned on; meanwhile, the bits latched (stored) at the latching terminals 210a, 210b are read out and then respectively written back to the activated memory cell 202a through the bitlines B, BB.

Figure 3:
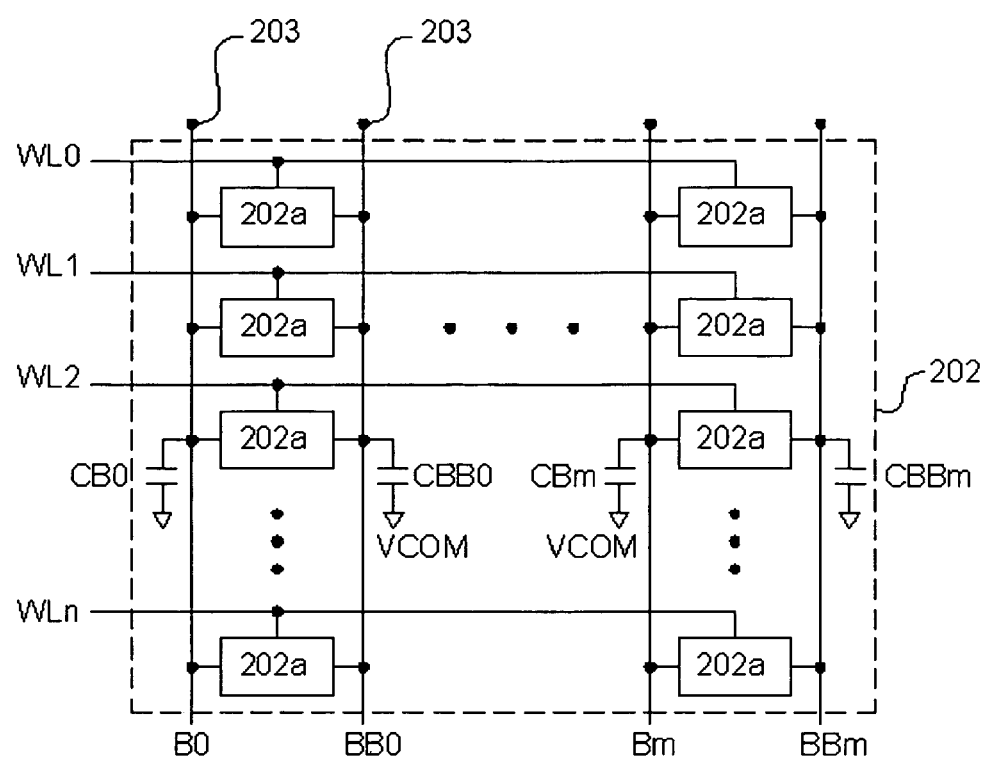
FIG. 3 is a schematic architecture of a memory cell array according to one embodiment of the present invention.

In FIG. 3, each bitline B0, BB0 and Bm, BBm is connected to all the memory cells in each cell column. It is assumed that each parasitic capacitor CB0, CBB0, CBm, CBBm at the bitlines B0, BB0, Bm, BBm in the memory cell array 202 has a capacitance CB, and each parasitic capacitor C1, C2 at the conductive lines 205a, 205b in the latch unit 204a has a capacitance C. As compared to the layout length of each bitline B0, BB0 and Bm, BBm, the layout length of each conductive line 205a, 205b according to the latch unit 204a of the present invention is far shorter. Therefore, the capacitance C of each conductive line 205a, 205b is far smaller than the capacitance CB of each bitline B0, BB0 and Bm, BBm. More specifically, when one bit is written to the latch unit 204a, the power consumption for charging or discharging each conductive line 205a, 205b connected to each latch unit 204a in the data latch circuit 204 is far smaller than that for charging or discharging each bitline B0, BB0 and Bm, BBm in the memory cell array 202.

The following paragraph will compare the power consumptions between the conventional memory architecture and the present memory architecture of display device while these two memory architecture are operated to achieve the data writing operations for x*y memory cells.

As compared to the frequency and voltage level for writing data to the conventional memory cell array 202, the frequency and voltage level for writing data to the data latch circuit 204 according to the present invention is the same. According to the formula that power is directly proportional to capacitance*the square of voltage*frequency, if it is assumed that the power consumption for charging or discharging once (one time) all the parasitic capacitors at the bitlines B0, BB0 and Bm, BBm is one power unit P while one bit is written to one memory cell of the memory cell array 202, then the power consumption for charging or discharging once (one time) the parasitic capacitors at the conductive lines 205a, 205b in all the latch units 204a is equal to (C/CB)*P while one bit is written to one latch unit 204a of the data latch circuit 204. The mark "/" herein is referred to division.

For the conventional memory architecture of display device, the total power consumption of achieving the data writing operations for x*y memory cells can be expressed as following equation:

$$\text{Total power consumption} = x*y*P \quad (1)$$

For the present memory architecture of display device, the power consumption of achieving the data writing operations for x*y memory cells can be expressed as following equation:

$$\text{Total power consumption} = (2+(C/CB)*x)*y*P \quad (2)$$

wherein "2" is contributed by the power consumption for charging or discharging twice (two times) all the parasitic capacitors at the bitlines B0, BB0 and Bm, BBm while data (i.e. bits) are read out from the memory cell array 202 and written to the data latch circuit 204 and while date (i.e. bits) are read out from the data latch circuit 204 and written back to the memory cell array 202. In addition, (C/CB)*x is contributed by the power consumption for charging or discharging, x times, the parasitic capacitors at the conductive lines 205a, 205b in all the latch units 204a while x bits are written to the data latch circuit 204 from an external circuit.

According to equations (2) and (1), it should be understood that the ratio of the power consumption of equation (2) to the power consumption of equation (1) is $1/((2/x)+(C/CB))$, wherein C is far smaller than CB. Therefore, as compared to the conventional one, the present memory architecture has more power efficiency while "x" in equation (1) and (2) is larger than 3.

According to the memory architecture of display device and the memory writing method of the present invention, a plurality of bits (i.e. data) to be written to one cell row can be stored in the data latch circuit in advance such that the bits stored in the data latch circuit can be simultaneously written to the memory cells of the cell row at one time while a wordline connect to the cell row is selected. As compared with the conventional method in which only one memory cell is to be written during one data writing operation, the memory architecture and the memory writing method of the present invention can write a plurality of bits into the memory cells of one cell row at one time while a corresponding wordline is selected; therefore, the memory architecture and the memory writing method according to the present invention can decrease the number of times for writing data to the memory cell array and thus decrease the number of times for charging and discharging the parasitic capacitors at the bitlines such that the power consumption caused by writing data to the memory cells can be efficiently decreased.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A memory architecture of a display device, comprising:
  a memory cell array having a plurality of memory cells arranged as a plurality of cell rows and a plurality of cell columns;

a data latch circuit having a plurality of latch units for respectively storing a plurality of bits; and a plurality of controlling switches each switch coupling a single latch unit with a single memory cell, allowing individual control of the writing of data to and from each particular latch unit and associated memory cell pair;

wherein when a memory cell in a particular cell row is activated, data bits stored in its associated latch unit are selectively transmitted to the memory cell by activating particular controlling switches associated with particular memory cells to thereby activate only those particular memory cells to which data is to be written.

2. The memory architecture of display device as claimed in claim 1, wherein the number of the latch units is equal to that of the memory cells in each cell row.

3. The memory architecture according to claim 1, further comprising:

a plurality of first bitlines respectively connected to each memory cell in each cell column; and a plurality of second bitlines independent of the first bit lines and respectively connected to each memory cell in each cell column, wherein the first bitline and the second bitline connect to the memory cells in the same cell column are used for transmitting two complementary bits;

wherein each bit stored in each latch unit is transmitted to each memory cell through each first bitline and each second bitline.

4. The memory architecture of display device as claimed in claim 3, wherein each latch unit comprises:

a latch having a first latching terminal and a second latching terminal for respectively latching the two complementary bits;

a first MOS (metal oxide semiconductor) transistor having a gate electrically connected to the first latching terminal, a first connecting terminal electrically connected to a common voltage, and a second connecting terminal;

a second MOS (metal oxide semiconductor) transistor having a gate electrically connected to the second latching terminal, a first connecting terminal electrically connected to the common voltage, and a second connecting terminal;

a first switch having a first terminal electrically connected to the first latching terminal and a second terminal for receiving a first external bit such that the first external bit is latched at the first latching terminal;

a second switch having a first terminal electrically connected to the second latching terminal and a second terminal for receiving a second external bit such that the second external bit is latched at the second latch terminal, wherein the second external bit is complementary to the first external bit;

a third switch having a first terminal electrically connected to the second connecting terminal of the second MOS transistor and a second terminal electrically connected to the second terminal of the first switch for outputting the first external bit to one of the first bitlines; and a fourth switch having a first terminal electrically connected to the second connecting terminal of the first MOS transistor and a second terminal electrically connected to the second terminal of the second switch for outputting the second external bit to one of the second bitlines.

5. The memory architecture of display device as claimed in claim 4, wherein the latch comprises:

a first inverter having a first input terminal and a first output terminal; and a second inverter having a second input terminal electrically connect to the first output terminal of the first inverter so as to form the first latching terminal, and a second output terminal electrically connected to the first input terminal of the first inverter so as to form the second latching terminal.

6. The memory architecture of display device as claimed in claim 4, wherein each latch unit further comprises:

a fifth switch having a first terminal electrically connected to the second terminals of the first switch and the third switch, and a second terminal electrically connected to the one of the first bitlines; and a sixth switch having a first terminal electrically connected to the second terminals of the second switch and the fourth switch, and a second terminal electrically connected to the one of the second bitlines.

7. The memory architecture of display device as claimed in claim 6, wherein the first, second, third, fourth, fifth and sixth switches are implemented by MOS transistors.

8. The memory architecture of display device as claimed in claim 1, which is used for a mobile phone.

9. The memory architecture of display device as claimed in claim 1, which is used for a PDA (personal digital assistant).

10. A memory architecture of a display device, comprising:

a memory cell array having a plurality of memory cells arranged as a plurality of cell rows and a plurality of cell columns;

a plurality of wordlines connected to each memory cell of respective cell rows for selectively turning on each memory cell of an associated cell row;

a plurality of first bitlines connected to each memory cell of respective cell columns;

a data latch circuit having a plurality of latch units for storing a plurality of bits, and each latch unit respectively connected to all memory cells of an associated column through an associated first bitline; and a plurality of controlling switches each switch coupling a single latch unit with a single memory cell;

wherein when one of the wordlines turns on each memory cell in an associated cell row, data bits stored in associated data latch units are selectively transmitted to associated memory cells in the associated cell row through the first bitline by activating only particular controlling switches associated with memory cells into which data is to be written.

11. The memory architecture of display device as claimed in claim 10, wherein the number of the latch units is equal to that of the memory cells in each cell row.

12. The memory architecture of display device as claimed in claim 10, further comprising:

a plurality of second bitlines independent from the first bitlines and respectively connected to each memory cell in each cell column, wherein the first bitline and the second bitline connect to the memory cells in the same cell column are used for transmitting two complementary bits;

wherein each bit stored in each latch unit is transmitted to each memory cell through each first bitline and each second bitline.

13. The memory architecture of display device as claimed in claim 12, wherein each latch unit comprises:

a latch having a first latching terminal and a second latching terminal for respectively latching the two complementary bits;

a first MOS (metal oxide semiconductor) transistor having a gate electrically connected to the first latching terminal, a first connecting terminal electrically connected to a common voltage, and a second connecting terminal;

a second MOS (metal oxide semiconductor) transistor having a gate electrically connected to the second latching terminal, a first connecting terminal electrically connected to the common voltage, and a second connecting terminal;

a first switch having a first terminal electrically connected to the first latching terminal and a second terminal for receiving a first external bit such that the first external bit is latched at the first latching terminal;

a second switch having a first terminal electrically connected to the second latching terminal and second terminal for receiving a second external bit such that the second external bit is latched at the second latching terminal, wherein the second external bit is complementary to the first external bit;

a third first switch having a first terminal electrically connected to the second connecting terminal of the second MOS transistor and a second terminal electrically connected to the second terminal of the first switch for outputting the first external bit to one of the first bitlines; and a fourth switch having a first terminal electrically connected to the second connecting terminal of the first MOS transistor and a second terminal electrically connected to the second terminal of the second switch for outputting the second external bit to one of the second bitlines.

14. The memory architecture of display device as claimed in claim 13, wherein the latch comprises:

a first inverter having a first input terminal and a first output terminal; and a second inverter having a second input terminal electrically connect to the first output terminal of the first inverter so as to form the first latching terminal, and a second output terminal electrically connected to the first input terminal of the first inverter so as to form the second latching terminal.

15. The memory architecture of display device as claimed in claim 13, wherein each latch unit further comprises:

a fifth switch having a first terminal electrically connected to the second terminals of the first switch and the third switch, and a second terminal electrically connected to the one of the first bitlines; and a sixth switch having a first terminal electrically connected to the second terminals of the second switch and the fourth switch, and a second terminal electrically connected to the one of the second bitlines.

16. The memory architecture of display device as claimed in claim 15, wherein the first, second, third, fourth, fifth and sixth switches are implemented by MOS transistors.

17. The memory architecture of display device as claimed in claim 10, which is used for a mobile phone.

18. The memory architecture of display device as claimed in claim 10, which is used for a PDA (personal digital assistant).

19. A memory writing method applied to a memory architecture of display device, the memory architecture comprising a memory cell array having a plurality of memory cells arranged in a plurality of cell rows and a plurality of cell columns, a data latch circuit having a plurality of data latch units, a plurality of controlling switches each switch being associated with a single memory cell and a single latch unit, the method comprising:

reading a plurality of bits from the memory cell array and writing the plurality of bits into the data latch circuit;

updating the bits written to the data latch circuit;

reading the updated bits from the data latch circuit; and selectively writing updated bits back to the memory cell array according to the activation of individual controlling switches.

20. The memory writing method as claimed in claim 19, wherein the bits written to the data latch circuit is read out from each memory cell in one of the cell rows.

21. The memory writing method as claimed in claim 19, wherein the memory architecture is used for a mobile phone.

22. The memory writing method as claimed in claim 19, wherein the memory architecture is used for a PDA (personal digital assistant).

23. A memory writing method applied to a memory architecture of a display device, the memory architecture comprising a memory cell array having a plurality of memory cells arranged as a plurality of cell rows and a plurality of cell columns, a data latch circuit having a plurality of data latch units, and a plurality of controlling switches each switch being associated with a single latch unit and a single memory cell, the method comprising:

reading a plurality of first bits from an external circuit and writing the plurality of first bits into the data latch circuit;

reading the plurality of first bits out from the data latch circuit; and selectively writing the plurality of first bits into particular memory cells in one of the cell rows according to the activation of specific controlling switches associated with cells to be written to.

24. The memory writing method as claimed in claim 23, further comprising a step of:

turning on each memory cell in the one of the cell rows.

25. A memory writing method according to claim 23, wherein before the step of reading a plurality of first bits from an external circuit, the memory writing method further comprises:

reading a plurality of second bits out from the memory cells in the one of the cell rows and writing the plurality of second bits into the data latch circuit.

26. The memory writing method as claimed in claim 23, wherein the memory architecture is used for a mobile phone.

27. The memory writing method as claimed in claim 23, wherein the memory architecture is used for a PDA (personal digital assistant).

* * * * *